(12) United States Patent
Zhan et al.

(10) Patent No.: US 11,889,676 B2
(45) Date of Patent: Jan. 30, 2024

(54) METHOD FOR MANUFACTURING CAPACITOR, CAPACITOR ARRAY STRUCTURE AND SEMICONDUCTOR MEMORY

(71) Applicant: CHANGXIN MEMORY TECHNOLOGIES, INC., Hefei (CN)

(72) Inventors: Kangshu Zhan, Hefei (CN); Jun Xia, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 155 days.

(21) Appl. No.: 17/594,922

(22) PCT Filed: Jun. 17, 2021

(86) PCT No.: PCT/CN2021/100735
§ 371 (c)(1),
(2) Date: Nov. 3, 2021

(87) PCT Pub. No.: WO2022/028122
PCT Pub. Date: Feb. 10, 2022

(65) Prior Publication Data
US 2023/0139419 A1    May 4, 2023

(30) Foreign Application Priority Data
Aug. 5, 2020    (CN) .......................... 202010778901.9

(51) Int. Cl.
*H10B 12/00*    (2023.01)
(52) U.S. Cl.
CPC .......... *H10B 12/033* (2023.02); *H10B 12/31* (2023.02)

(58) Field of Classification Search
CPC ... H01L 21/027; H01L 21/2254; H01L 21/31; H01L 21/469; H01L 21/02118
See application file for complete search history.

(56) References Cited

U.S. PATENT DOCUMENTS 6,461,941 B2    10/2002    Kim
9,651,869 B2    5/2017    Chang et al.
(Continued)

FOREIGN PATENT DOCUMENTS

| | | |
|---|---|---|
| CN | 107731794 A | 2/2018 |
| CN | 110970402 A | 4/2020 |
| KR | 20070071613 A | 7/2007 |

OTHER PUBLICATIONS

International Search Report cited in PCT/CN2021/100735 dated Aug. 23, 2021, 8 pages.

*Primary Examiner* — Edward Chin
(74) *Attorney, Agent, or Firm* — Cooper Legal Group, LLC

(57) ABSTRACT

The present disclosure discloses a method for manufacturing a capacitor, a capacitor array structure and a semiconductor memory. The method for manufacturing a capacitor includes: providing an underlayer; forming a substrate to be etched on the underlayer; enabling a wafer to include a central area and an edge area; forming a first hard mask layer having a first pattern in the central area on the substrate to be etched; using the first hard mask layer as a mask to etch the substrate to be etched, to form capacitor holes; depositing a lower electrode layer; and sequentially forming a capacitor dielectric layer and an upper electrode layer.

14 Claims, 16 Drawing Sheets

(56) References Cited

U.S. PATENT DOCUMENTS

| | | | |
|---|---|---|---|
| 2007/0232013 A1* | 10/2007 | Manning | H10B 12/033 |
| | | | 438/386 |
| 2012/0037970 A1* | 2/2012 | Park | H01L 28/91 |
| | | | 257/296 |
| 2013/0005110 A1* | 1/2013 | Yoon | H01L 28/90 |
| | | | 438/381 |
| 2019/0348417 A1* | 11/2019 | Yokoyama | H01L 27/0605 |
| 2021/0272961 A1* | 9/2021 | Tung | H10B 12/485 |
| 2023/0139419 A1* | 5/2023 | Zhan | H10B 12/31 |
| | | | 257/296 |

* cited by examiner

METHOD FOR MANUFACTURING CAPACITOR, CAPACITOR ARRAY STRUCTURE AND SEMICONDUCTOR MEMORY

CROSS-REFERENCE TO RELATED APPLICATIONS

The present application claims the priority to Chinese Patent Application 202010778901.9, titled "METHOD FOR MANUFACTURING CAPACITOR, CAPACITOR ARRAY STRUCTURE AND SEMICONDUCTOR MEMORY", filed on Aug. 5, 2020, which is incorporated herein by reference in its entirety.

TECHNICAL FIELD

The present disclosure relates to, but is not limited to, a method for manufacturing a capacitor, a capacitor array structure and a semiconductor memory.

BACKGROUND

A dynamic random access memory (DRAM), which is composed of massive identical memory cells, is a semiconductor memory device commonly used in a computer. A gate of a transistor is connected to a word line, a drain is connected to a bit line and a source is connected to a capacitor. A voltage signal on the word line can control the transistor to be turned on or off. Therefore, data information stored in the capacitor is read through the bit line, or data information is written into the capacitor through the bit line for storage.

The DRAM is increasingly integrated and a lateral size of an element is increasingly miniaturized with the aid of the continuous evolution of a manufacturing process. Thus, the capacitor has a high aspect ratio, and is more difficult to manufacture. Particularly, in a technological process of manufacturing the capacitor, since a die in an edge area of a wafer is invalid, and a graph in the edge area of the wafer may collapse and peel off in an etching process, the integrity of partial capacitors in a central area of the wafer is damaged, which causes the pollution to the wafer and a process chamber of the wafer, and the reduction in the yield and the production efficiency of the die.

SUMMARY

A method for manufacturing a capacitor provided in the embodiment of the present disclosure includes:

providing a wafer, the wafer including a plurality of dies distributed in an array, and the dies having the same underlayer; forming a substrate to be etched on the underlayer, the substrate to be etched including at least one sacrificial layer and at least one support layer, the sacrificial layer and the support layer being alternately arranged, and one side, away from the underlayer, of the substrate to be etched being a first support layer;

enabling the wafer to include a central area and an edge area surrounding the central area;

forming a first hard mask layer having a first pattern in the central area on the substrate to be etched, the first pattern including through holes arranged in an array; using the first hard mask layer as a mask to etch the substrate to be etched, to form capacitor holes, no capacitor hole being formed in the edge area;

depositing a lower electrode layer on a bottom and a side wall of each of the capacitor holes, and removing, layer by layer, part of the substrate to be etched; and sequentially forming a capacitor dielectric layer and an upper electrode layer on the lower electrode layer.

A capacitor array structure provided in some embodiments of the present disclosure is made through a method for manufacturing the capacitor provided by any embodiment of the present disclosure.

A semiconductor memory provided in some embodiments of the present disclosure includes the capacitor array structure provided by any embodiment of the present disclosure, and a transistor layer including a transistor arranged in one-to-one correspondence with the capacitor.

BRIEF DESCRIPTION OF THE DRAWINGS

The accompanying drawings, which are incorporated in the description and constituent a part of the description, illustrate the embodiments of the present disclosure and are used to explain the principle of the embodiments of the present disclosure together with the descriptions. In these accompanying drawings, similar reference numerals are used to refer to similar elements. The accompanying drawings described below are some, but not all, embodiments of the present disclosure. Those of ordinary skill in the art may derive other accompanying drawings from these accompanying drawings without making inventive efforts.

DETAILED DESCRIPTION

The present disclosure will be described in detail below with reference to the accompanying drawings and the embodiments. It is to be understood that the specific embodiments described herein are merely illustrative of the present disclosure, instead of limiting the present disclosure. It should also be noted that, for ease of description, only some structures relevant to the present disclosure are shown in the accompanying drawings, rather than all of them.

Figure 1:
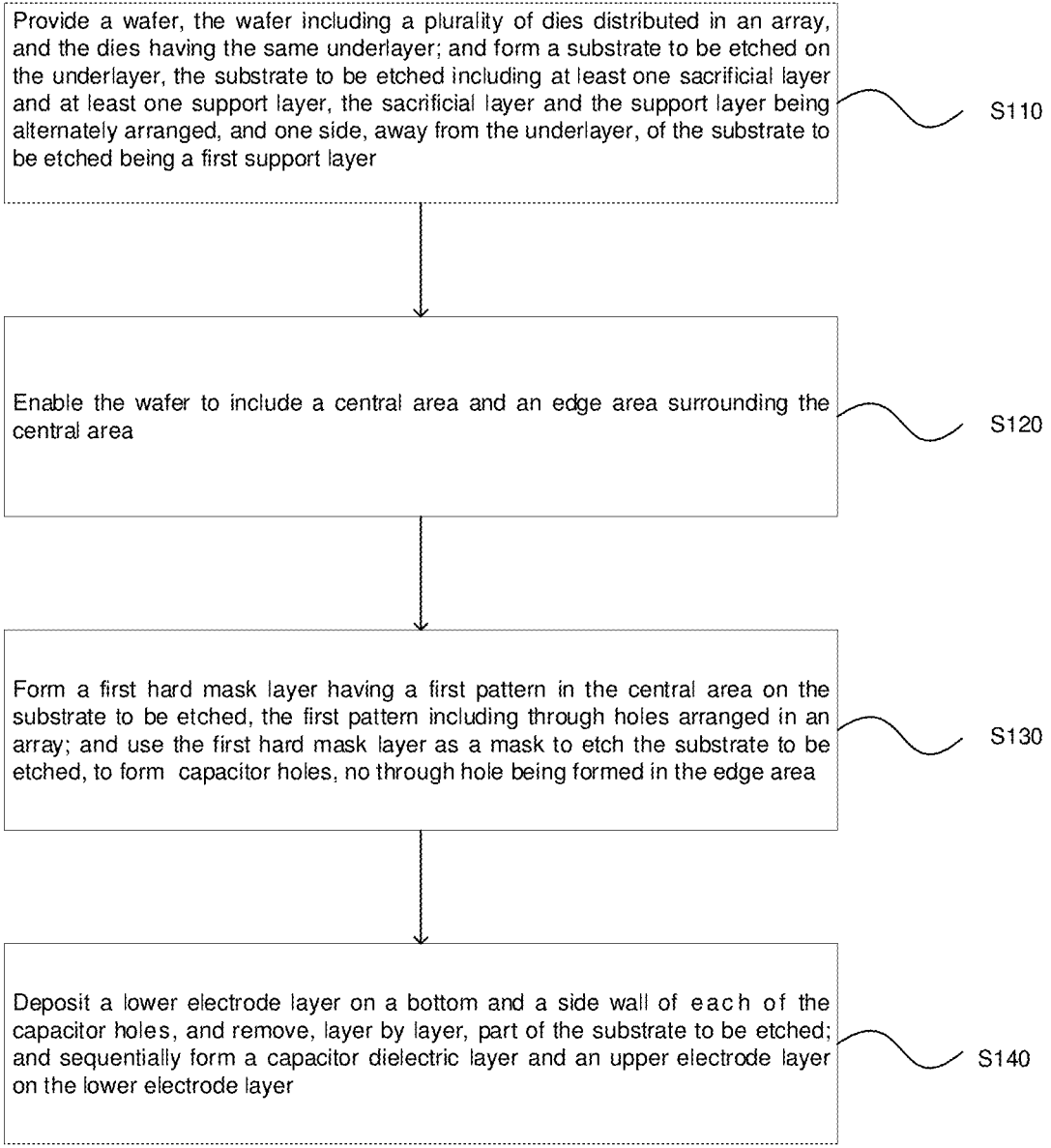
FIG. 1 is a schematic flowchart of a method for manufacturing a capacitor provided in the embodiment of the present disclosure.

The embodiment of the present disclosure provides a method for manufacturing a capacitor. FIG. 1 is a schematic flowchart of a method for manufacturing a capacitor provided in the embodiment of the present disclosure. As shown in FIG. 1, the method of the present embodiment includes:

S110, provide a wafer 1, the wafer 1 including a plurality of dies distributed in an array, and the dies having the same underlayer 10; and form a substrate to be etched 11 on the underlayer 10, the substrate to be etched 11 including at least one sacrificial layer 112 and at least one support layer 111, the sacrificial layer 112 and the support layer 111 being alternately arranged, and one side, away from the underlayer 10, of the substrate to be etched 11 being a first support layer 111a.

Figure 2:
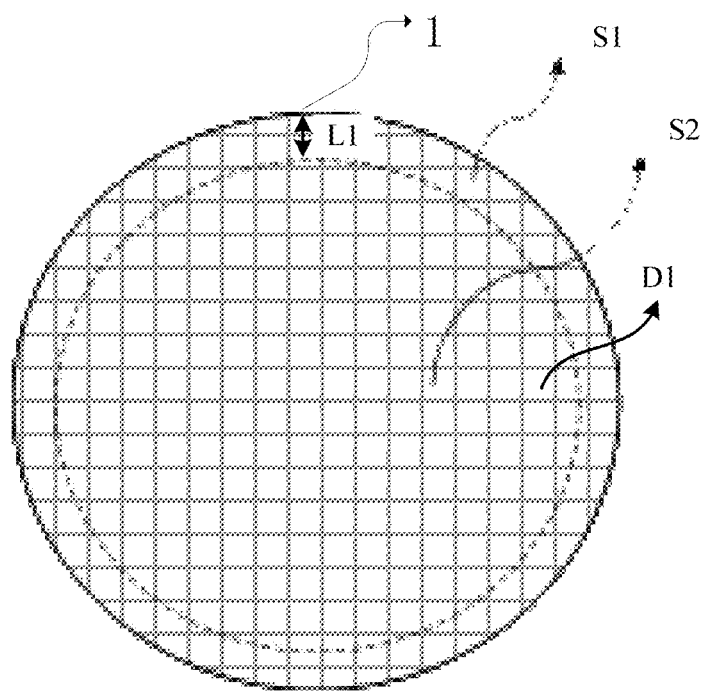
FIG. 2 is a plane structural schematic diagram of a wafer provided in the embodiment of the present disclosure.

FIG. 2 is a plane structural schematic diagram of the wafer 1 provided in the embodiment of the present disclosure. As shown in FIG. 2, one wafer 1 is provided. The wafer 1 may be a wafer such as undoped monocrystalline silicon, monocrystalline silicon doped with an impurity, silicon on insulator (SOI), stacked silicon on insulator (SSOI), stacked-silicon germanium on insulator (S-SiGeOI), silicon germanium on insulator (SiGeOI), a germanium on insulator (GeOI), etc. The wafer 1 is composed of a plurality of dies D1 distributed in an array, each of the plurality of dies D1 including an array region of a memory area (configured to provide a capacitor structure) and a peripheral region of a circuit control area. In a process of manufacturing the capacitor, an array region capacitor in an edge area S1 of the wafer 1 is prone to collapse and peel off, thereby influencing a yield of a die in a central area S2. The present disclosure overcomes collapse of a capacitor pillar in the edge area S1 by avoiding forming a capacitor structure in the edge area S1, thereby increasing a yield of the wafer.

Figure 3:
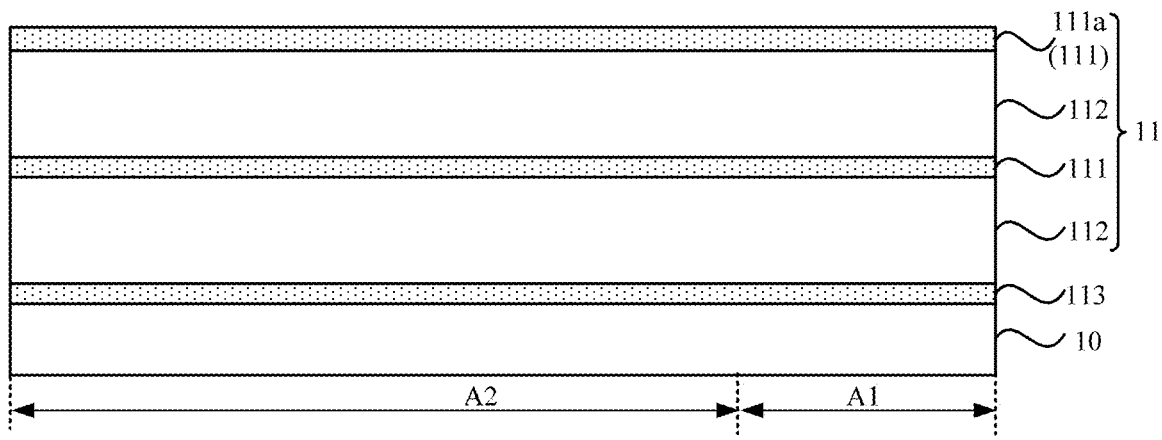
FIG. 3 is a structural schematic diagram of forming a substrate to be etched on an underlayer provided in the embodiment of the present disclosure.

It is to be understood that all underlayers 10 for the dies are all formed through the same process, that is, the plurality of dies have the same underlayer 10. In the embodiment of the present disclosure, one or two dies may be described. FIG. 3 is a structural schematic diagram of forming the substrate to be etched 11 on the underlayer 10 provided in the embodiment of the present disclosure. As shown in FIG. 3, A2 denotes an array region, A1 denotes a peripheral region, and the underlayer 10 includes a capacitor contact (not shown). When the capacitor is formed, the substrate to be etched 11 is formed on the underlayer 10, the substrate to be etched 11 including at least one sacrificial layer 112 and at least one support layer 111, the sacrificial layer 112 and the support layer 111 being alternately arranged, one side, away from the wafer 1, of the substrate to be etched 11 being the first support layer 111a, that is, a top layer of the substrate to be etched 11 being the first support layer 111a. The substrate to be etched 11 is configured for etching of a capacitor hole 11a in a subsequent process of manufacturing a capacitor. Exemplarily, as shown in FIG. 3, in the present embodiment, two support layers 111 and two sacrificial layers 112 may be arranged. The number of the support layer 111 and the sacrificial layer 112 may be set according to a required height of the capacitor in a later stage, and a plurality of support layers 111 and a plurality of sacrificial layers 112 may be stacked, where, it is preferable to stack 2 to 5 layers. In the present embodiment, an etch stop layer 113 is further formed between the underlayer 10 and the sacrificial layer 112.

S120, enable the wafer 1 to include a central area S2 and the edge area S1 surrounding the central area S2.

With continued reference to FIG. 2, the wafer 1 may include the central area S2 and the edge area S1 surrounding the central area S2, that is, the dies D1 distributed in the array may be divided into a die D1 in the central area S2 and a die D1 in the edge area S1. In the embodiment of the present disclosure, the central area S2 refers to the dies D1 distributed in the central area S2, and the edge area S1 refers to the dies D1 distributed in the edge area S1.

With continued reference to FIG. 2, the edge area S1 may have a width L1 less than or equal to 8 mm in a direction from the central area S2 to the edge area S1, in order to utilize an area of an active die in the wafer 1 to a maximum degree.

With continued reference to FIGS. 2 and 3, in an embodiment, a portion, in the edge area S1, of the first support layer 111a is removed after the substrate to be etched 11 is formed on the underlayer 10.

Since no capacitor hole 11a is formed in the edge area S1, that is, the portion, in the edge area S1, of the first support layer 111a and a lower support layer 111 will not be fixedly connected through a lower electrode layer, when the sacrificial layer 112 is etched by forming an opening on the first support layer 111a in a later stage, the portion, in the edge area S1, of the first support layer 111a collapses or peels off because it is not fixedly connected to the lower support layer 111, thereby influencing a yield of the die D1 in the central area S2. In the present embodiment, after the substrate to be etched 11 is formed on the underlayer 10, the portion, in the edge area S1, of the first support layer 111a is removed first. By removing the portion, in the edge area S1, of the first support layer 111a after the substrate to be etched 11 is formed, the situation mentioned above may be avoided, and a production quality of the capacitor may be improved.

Removing the portion, in the edge area S1, of the first support layer 111a may include: exposing the portion, for the dies in the edge area S1, of the first support layer 111a through a photoetching process, and etching an exposed portion of the first support layer 111a. The present embodiment may etch the first support layer 111a through wet etching or dry etching. For example, the first support layer 111a is wet etched through a thermal phosphoric acid, and a specific etching method for the first support layer 111a is not limited in the present embodiment.

Figure 4:
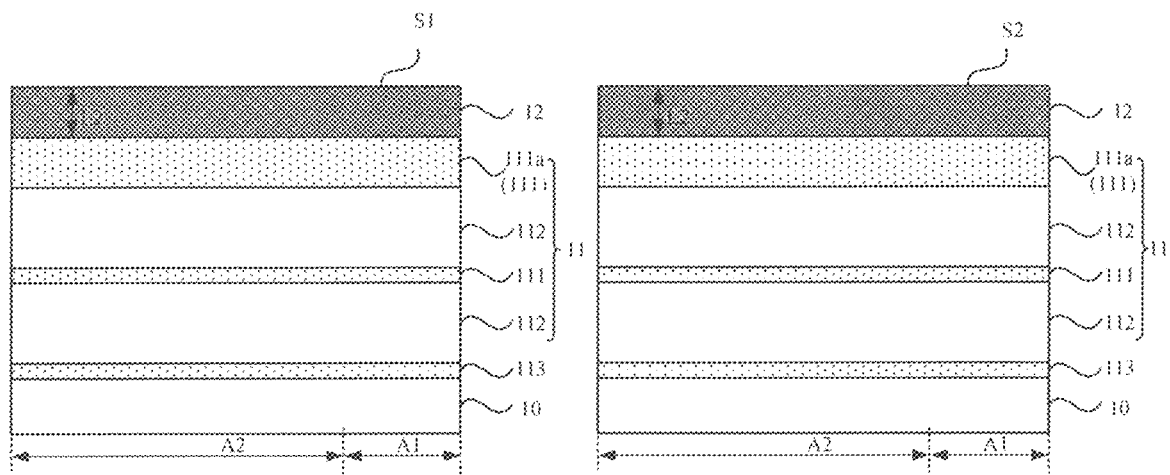
FIG. 4 is a structural schematic diagram of forming a first photoresist on the substrate to be etched provided in the embodiment of the present disclosure.

FIG. 4 is a structural schematic diagram of forming a first photoresist 12 on the substrate to be etched 11 provided in the embodiment of the present disclosure. Exposing the portion, for the die D1 in the edge area S1, of the first support layer 111a through a photoetching process may include: coating the substrate to be etched 11 with a first positive photoresist 12; exposing the edge area S1 of the wafer 1 through a blank mask; and forming an edge area S1 exposing the sacrificial layer 112 after development.

Figure 5:
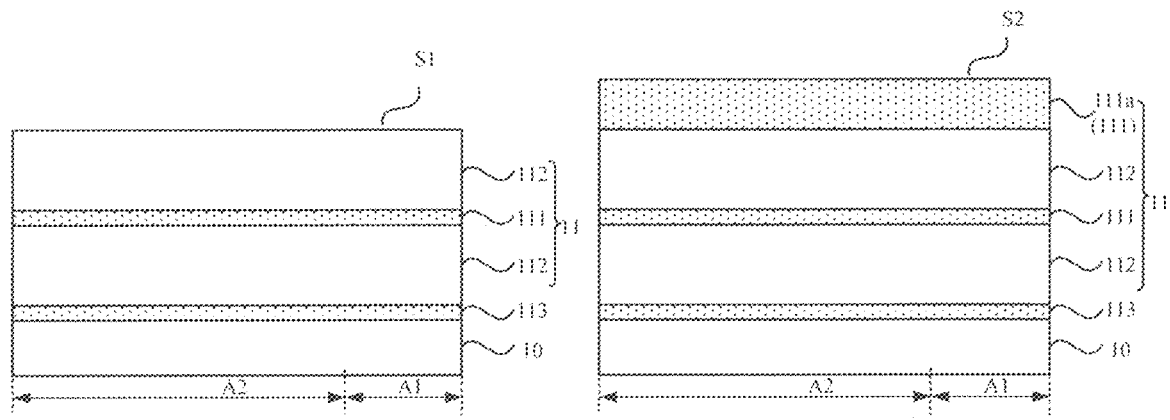
FIG. 5 is a structural schematic diagram of etching a portion, in an edge area, of a first support layer provided in the embodiment of the present disclosure.

As shown in FIG. 4, when the substrate to be etched 11 is coated with the first positive photoresist 12, after exposure and development, a portion, in an exposed area, of the positive photoresist is etched away, while after exposure and development, a portion, in an unexposed area, of a negative photoresist is etched away. In the present embodiment, by applying the first positive photoresist 12, and exposing the edge area S1, the portion, in the edge area S1, of the first support layer 111a is exposed after the development. Particularly, in the present embodiment, the edge area S1 of the wafer 1 is exposed (by shot) through the blank mask. Then the portion, in the edge area S1, of the first support layer 111a is etched. FIG. 5 is a structural schematic diagram of etching the portion, in the edge area S1, of the first support layer 111a provided in the embodiment of the present disclosure. As shown in FIG. 5, the portion, in the edge area S1, of the first support layer 111a is removed from a wafer structure shown in FIG. 4 to obtain a die structure in the edge area S1 shown in FIG. 5. Correspondingly, a die structure in the central area S2 shown in FIG. 5 is obtained without removing a portion, in the central area S2, of the first support layer 111a. The first photoresist 12 may have a thickness L2 of 50-200 nm, preferably, 80-120 nm.

S130, form a first hard mask layer 13 having a first pattern 16 in the central area S2 on the substrate to be etched 11, the first pattern 16 including through holes 131 arranged in an array; use the first hard mask layer 13 as a mask to etch the substrate to be etched 11, to form capacitor holes 11a, no through hole 131 being formed in the edge area S1.

Figure 6:
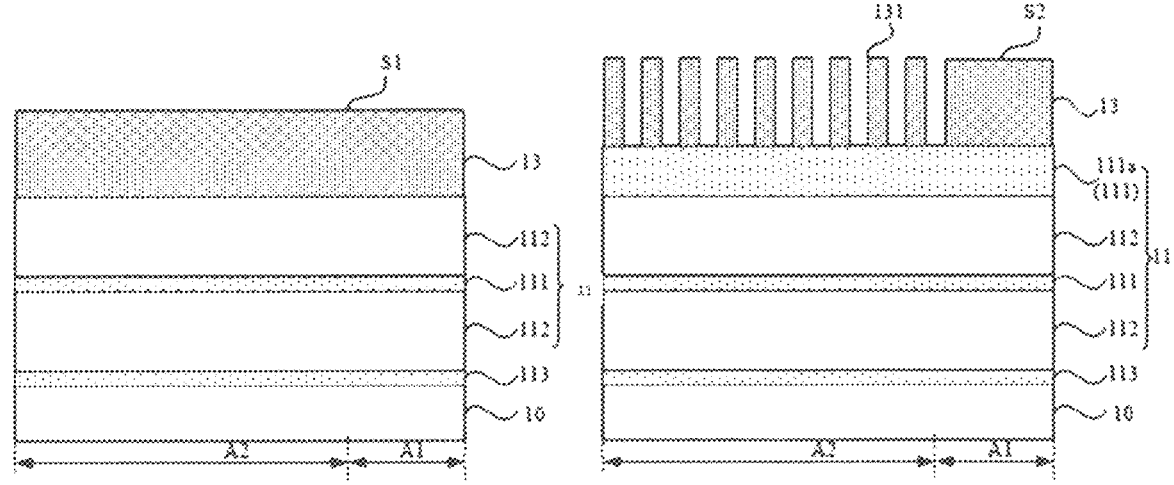
FIG. 6 is a structural schematic diagram of forming a first hard mask layer on the substrate to be etched provided in the embodiment of the present disclosure.
Figure 7:
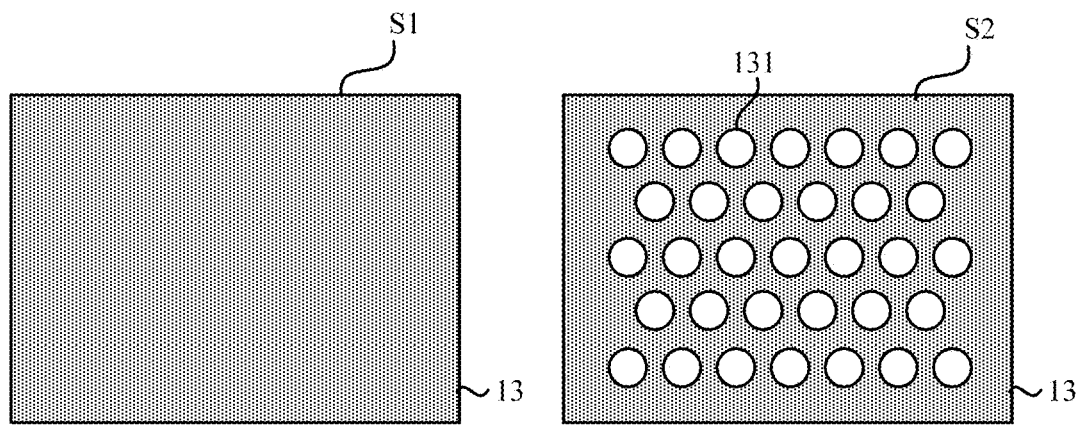
FIG. 7 is a top view of the first hard mask layer in FIG. 6.
Figure 8:
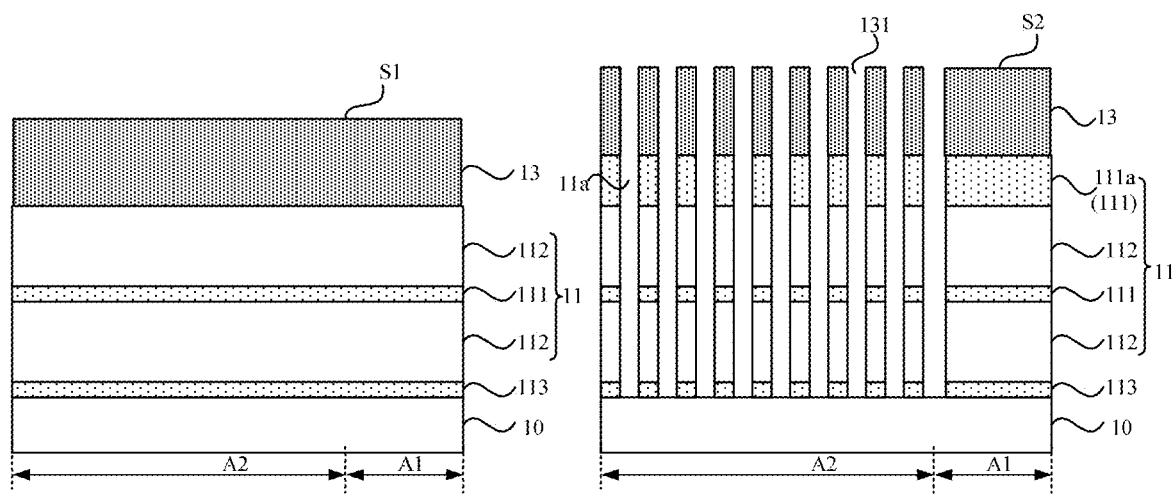
FIG. 8 is a structural schematic diagram of forming capacitor holes on the substrate to be etched provided in the embodiment of the present disclosure.

FIG. 6 is a structural schematic diagram of forming the first hard mask layer 13 on the substrate to be etched 11 provided in the embodiment of the present disclosure. As shown in FIG. 6, the first hard mask layer 13 includes the first pattern 16 in the central area S2, the first pattern 16 including the through holes 131 arranged in the array. FIG. 7 is a top view of the first hard mask layer 13 in FIG. 6. As shown in FIG. 7, in a direction parallel to the plane of the wafer 1, the through holes 131 may be circular, or certainly rectangular, etc. As shown in FIGS. 6 and 7, no through hole 131 is formed in the edge area S1. The first hard mask layer 13 with the through holes 131 is used as the mask to etch the substrate to be etched 11. FIG. 8 is a structural schematic diagram of forming the capacitor holes 11a on the substrate to be etched 11 provided in the embodiment of the present disclosure. As shown in FIG. 8, the capacitor holes 11a are formed on the substrate to be etched 11, each capacitor hole 11a being arranged in one-to-one correspondence with each through hole 131. Since a portion, in the edge area S1, of the first hard mask layer 13 is not provided with a through hole 131, no capacitor hole 11a is formed on a portion, in the edge area S1, of the substrate to be etched 11 when the first hard mask layer 13 is used as the mask to etch the substrate to be etched 11. According to the present disclosure, since no capacitor hole 11a is formed on the die in the edge area S1 of the wafer 1, a situation that a capacitor pillar in the edge area S1 is prone to collapse and peel off in a subsequent process, thereby influencing the yield of the die in the central area S2 of the wafer 1 is avoided.

S140, deposit a lower electrode layer 14 on a bottom and a side wall of each capacitor hole 11a, and remove, layer by layer, part of the substrate to be etched 11; and sequentially form a capacitor dielectric layer and an upper electrode layer on the lower electrode layer 14.

Figure 9:
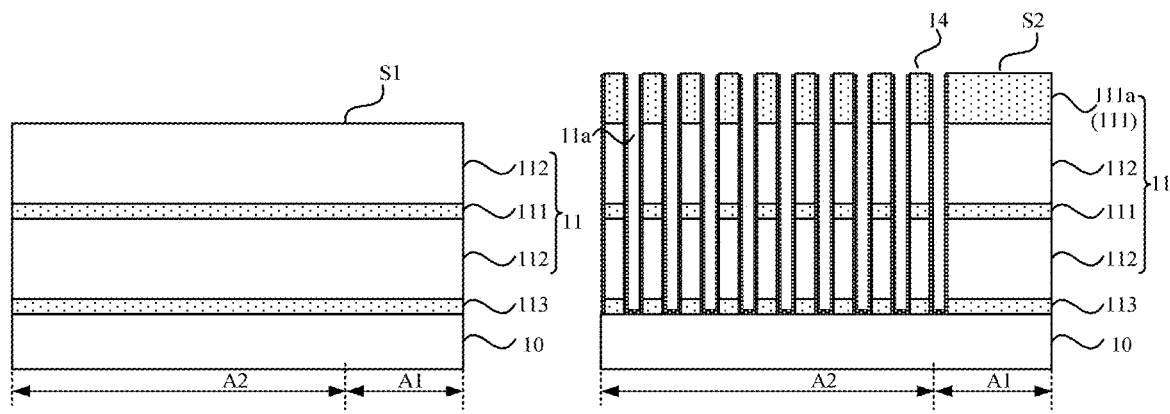
FIG. 9 is a structural schematic diagram of depositing a lower electrode layer on the capacitor holes provided in the embodiment of the present disclosure.
Figure 10:
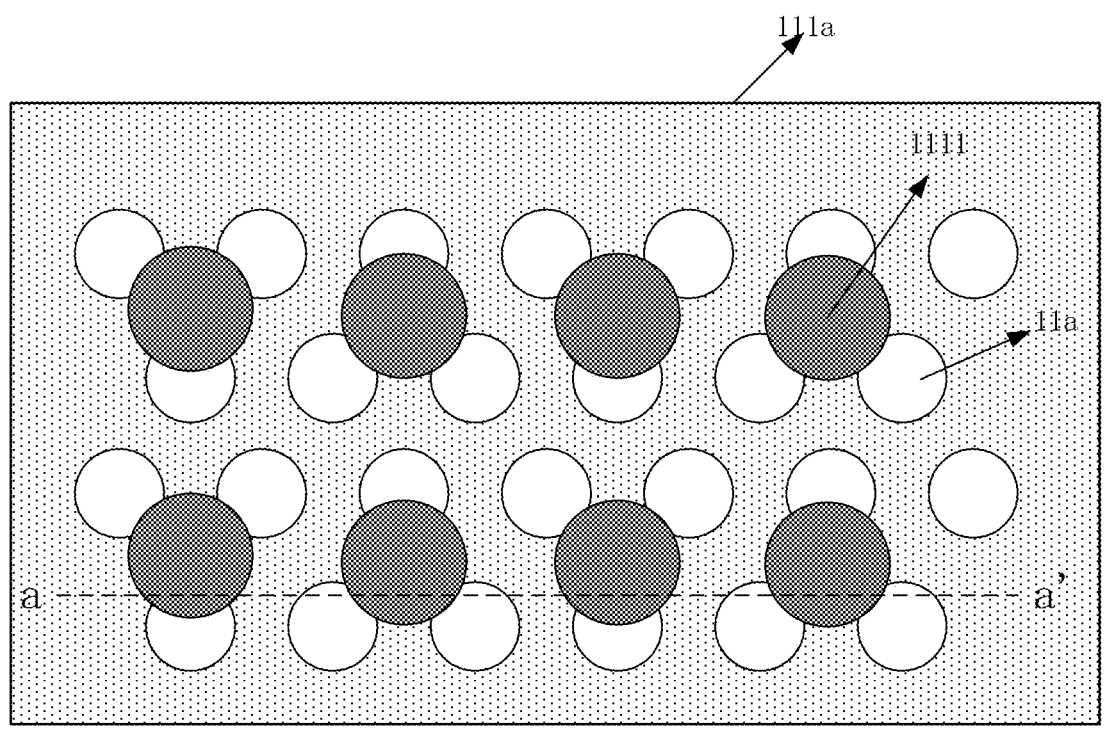
FIG. 10 is a structural schematic diagram of forming a first opening on the first support layer provided in the embodiment of the present disclosure.
Figure 11:
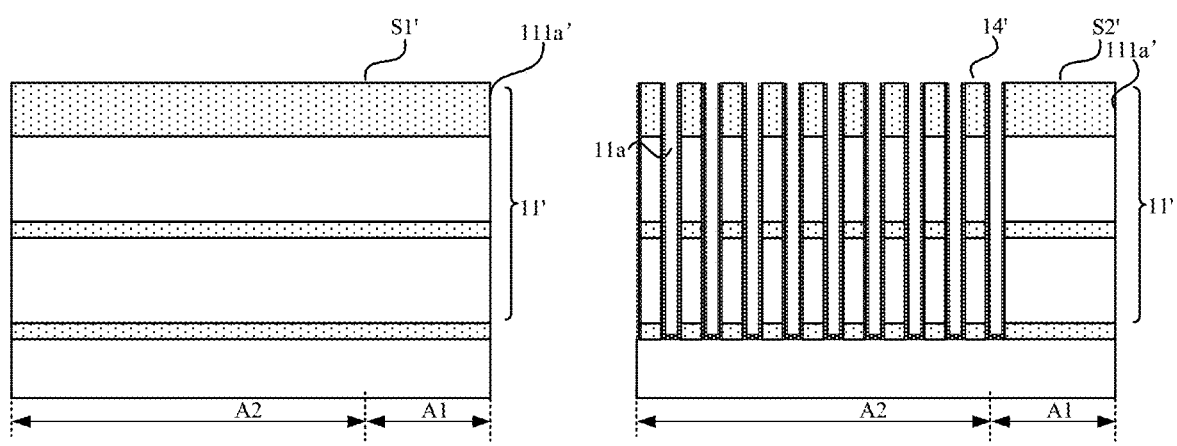
FIG. 11 is a schematic structural diagram of a comparative embodiment of depositing a lower electrode layer on a capacitor hole provided in the embodiment of the present disclosure.

After the capacitor holes 11a are formed by etching the substrate to be etched 11, where, no capacitor hole 11a is formed on the portion, in the edge area S1, of the substrate to be etched 11, the first hard mask layer 13 is removed. FIG. 9 is a structural schematic diagram of depositing the lower electrode layer 14 on the capacitor holes 11a provided in the embodiment of the present disclosure. As shown in FIG. 9, after the first hard mask layer 13 is removed, the lower electrode layer 14 is deposited on the bottom and the side wall of each capacitor hole 11a, and then part of the substrate to be etched 11 is removed layer by layer. Particularly, FIG. 10 is a structural schematic diagram of forming first openings 1111 on the first support layer 111a provided in the embodiment of the present disclosure. As shown in FIG. 10, when the sacrificial layer 112 is etched by forming the first openings 1111 on the first support layer 111a, no incomplete pattern of the first support layer 111a is formed in the edge area S1. Each first opening 1111 may be an opening among three capacitor holes 11a, or an opening among four or six capacitor holes 11a, which is not limited in the present embodiment. FIG. 11 is a structural schematic diagram of a comparative embodiment of depositing a lower electrode layer 14 on capacitor holes 11a provided in the embodiment of the present disclosure. With reference to FIG. 11, in the comparative embodiment shown in FIG. 11, a portion, in an edge area S1', of a first support layer 111a' is not removed when a substrate to be etched 11' is formed, and after a lower electrode layer 14' is deposited on a bottom and a side wall of each capacitor hole 11a', when a sacrificial layer is etched through first openings, a portion, in a central area S2', of the first support layer is firmly connected to a lower support layer through the lower electrode layer 14, while the portion, in the edge area S1', of the first support layer 111a' will directly peel off after the sacrificial layer is etched away, thereby polluting an manufacturing environment of a capacitor. However, in the present embodiment, no incomplete pattern of the first support layer 111a is formed in the edge area S1 of the capacitor as shown in FIG. 9, thereby effectively avoiding an influence, on a process of manufacturing the capacitor, from the first support layer 111a.

The lower electrode layer 14 may be deposited on the side wall and the bottom of each capacitor hole 11a and an upper surface of the substrate to be etched 11 through atomic layer deposition (ALD) or chemical vapor deposition (CVD). The lower electrode layer 14 is made from one or two compounds of metal nitride and metal silicide, such as titanium nitride, titanium silicide, titanium silicide and $TiSi_xN_y$, where, in the present embodiment, the lower electrode layer 14 is made from titanium nitride; and then an etching process is used to remove a lower electrode material layer on the upper surface of the substrate to be etched 11, and a portion, located on the side wall and the bottom of each capacitor hole 11a, of the lower electrode layer 14 is retained.

In the embodiment of the present disclosure, the process of manufacturing the capacitor includes: firstly, form a substrate to be etched 11 to prepare capacitor holes 11a, the substrate to be etched 11 including at least one sacrificial layer 112 and at least one support layer 111, the sacrificial layer 112 and the support layer 111 being alternately arranged, and the topmost layer being a first support layer 111a; enable a wafer 1 to include a central area S2 and an edge area S1 surrounding the central area S2; form a first hard mask layer 13 having a first pattern 16 on the substrate to be etched 11, the first pattern 16 including through holes 131 arranged in an array; use the first hard mask layer 13 as a mask to etch the substrate to be etched 11, to form the capacitor holes 11a, no capacitor hole 11a being formed in the edge area S1 given that no through hole 131 is formed on a portion, in the edge area S1, of the first hard mask layer 13, then deposit a lower electrode layer 14 on the capacitor holes 11a, remove, layer by layer, the substrate to be etched 11, and sequentially form a capacitor dielectric layer and an upper electrode layer. According to the present embodiment, since no capacitor structure is arranged in the edge area S1 of the wafer 1, a situation that owing to a process, the capacitor structure in the edge area S1 collapses, and thus an overall yield of the wafer 1 is influenced is avoided, and a production quality and production efficiency of the capacitor are improved accordingly.

In addition, by removing the portion, in the edge area S1, of the first support layer 111a, a situation that when the sacrificial layer 112 is subsequently etched, since the portion, in the edge area S1, of the first support layer 111a is not firmly connected to the lower support layer 111 through the lower electrode layer 14, the portion peels off to pollute the wafer 1 is avoided.

Figure 12:
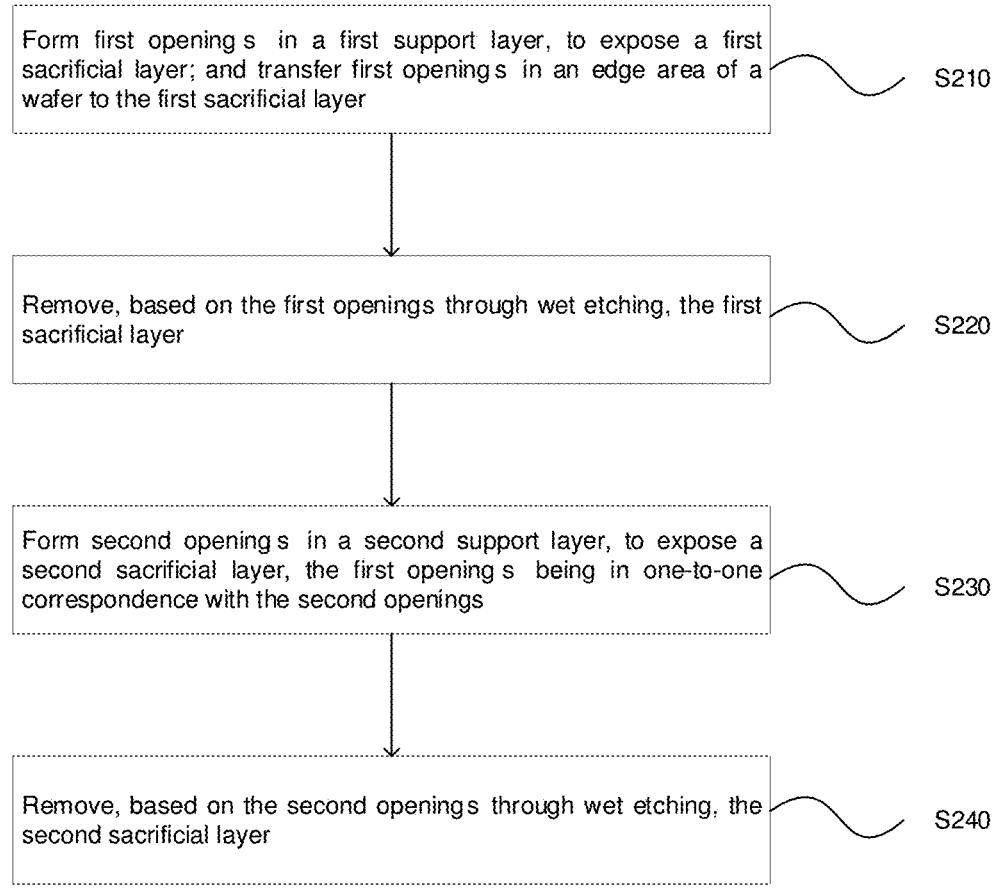
FIG. 12 is a schematic flowchart of another method for manufacturing a capacitor provided in the embodiment of the present disclosure.
Figure 13:
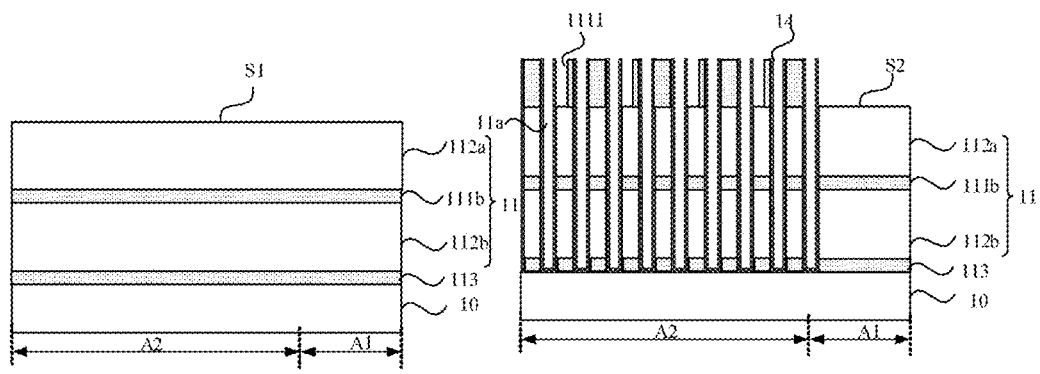
FIG. 13 is a structural schematic diagram of forming first openings in the first support layer provided in the embodiment of the present disclosure.

With continued reference to FIGS. 9 and 13, the substrate to be etched 11 may include: a second sacrificial layer 112b, a second support layer 111b, a first sacrificial layer 112a and the first support layer 111a which are sequentially formed in a direction away from the underlayer 10. A process of removing, layer by layer, part of the substrate to be etched 11 is shown in FIG. 12. FIG. 12 is a schematic flowchart of another method for manufacturing a capacitor provided in the embodiment of the present disclosure, where the method includes:

S210, form first openings 1111 in a first support layer 111a, to expose a first sacrificial layer 112a; and transfer first openings 1111 in an edge area S1 of a wafer 1 to the first sacrificial layer 112a.

As shown in FIGS. 9 and 13, a substrate to be etched 11 may include: a second sacrificial layer 112b, a second support layer 111b, the first sacrificial layer 112a and a first support layer 111a which are sequentially formed on the wafer 1 and in a process of removing, layer by layer, the substrate to be etched 11, the first support layer 111a, the first sacrificial layer 112a, the second support layer 111b and the second sacrificial layer 112b are sequentially removed.

Figure 14:
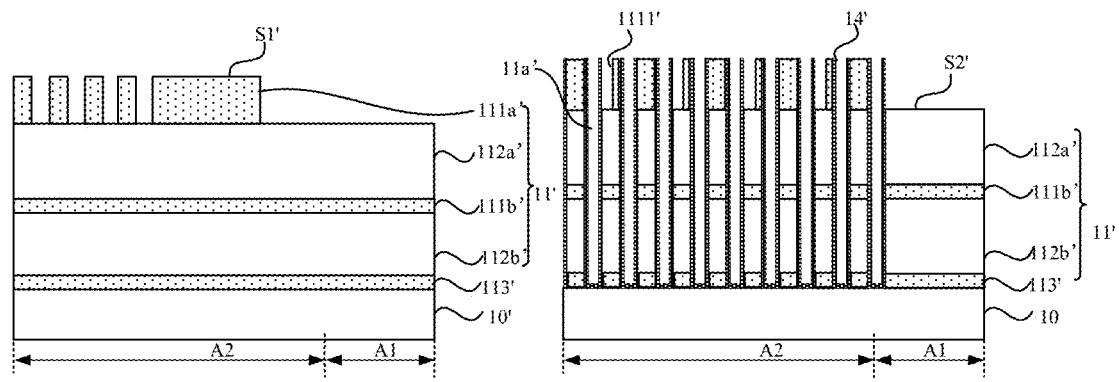
FIG. 14 is a structural schematic diagram of a comparative embodiment of forming first openings in a first support layer provided in the embodiment of the present disclosure.

It should be noted that the sacrificial layer 112 is made from silicon oxide or boro-phospho-silicate glass (BPSG), the sacrificial layer 112 may be doped with boron or phosphorus, and the support layer 111 is made from any one or a combination of any two or more of silicon nitride, silicon oxynitride and silicon carbonitride. When the substrate to be etched 11 is removed, the present embodiment includes: firstly, form the first openings 1111 in the first support layer 111a. FIG. 13 is a structural schematic diagram of forming the first openings 1111 in the first support layer 111a provided in the embodiment of the present disclosure. As shown in FIG. 13, an area S2 in FIG. 13 denotes a section in a direction of a-a' in FIG. 10. Before the first openings 1111 are formed in the first support layer 111a, a lower electrode layer 14 on the top of the first support layer 111a is removed through dry etching; and then an opening is formed on the first support layer 111a, to expose a portion, below each first opening 1111, of the first sacrificial layer 112a, and given that no first support layer 111a is arranged in an edge area S1 of the wafer 1, first openings 1111 in the edge area S1 are transferred to the first sacrificial layer 112a. FIG. 14 is a structural schematic diagram of a comparative embodiment of forming first openings 1111 in a first support layer 111a provided in the embodiment of the present disclosure. FIG. 14 shows that a portion, in an edge area S1', of a first support layer 111a' is not removed. After first openings 1111' are formed in the first support layer 111a' in FIG. 14, first openings 1111' in the edge area S1' are formed in the first support layer 111a', in addition, and when a first sacrificial layer 112a' is etched base on the first openings 1111', an entire portion, in the edge area S1', of the first support layer 111a' peels off without connection through a lower electrode layer.

S220, remove, based on the first openings 1111 through wet etching, the first sacrificial layer 112.

Figure 15:
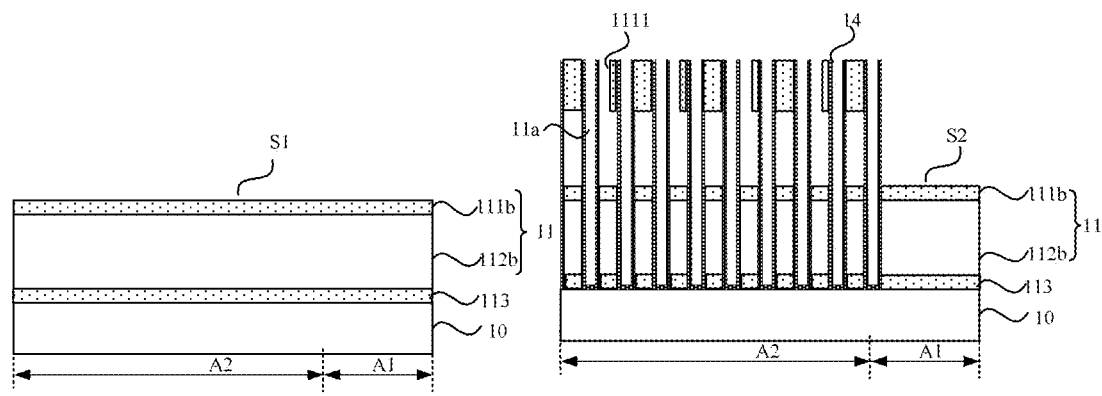
FIG. 15 is a structural schematic diagram of removing, based on the first openings, a first sacrificial layer provided in the embodiment of the present disclosure.

FIG. 15 is a structural schematic diagram of removing, based on the first openings 1111, the first sacrificial layer 112a provided in the embodiment of the present disclosure. In the present embodiment, the entire first sacrificial layer 112a shown in FIG. 13 is removed based on the first openings 1111 through wet etching.

S230, form second openings 1112 in the second support layer 111b, to expose the second sacrificial layer 112b, the first openings 1111 being in one-to-one correspondence with the second openings 1112.

Figure 16:
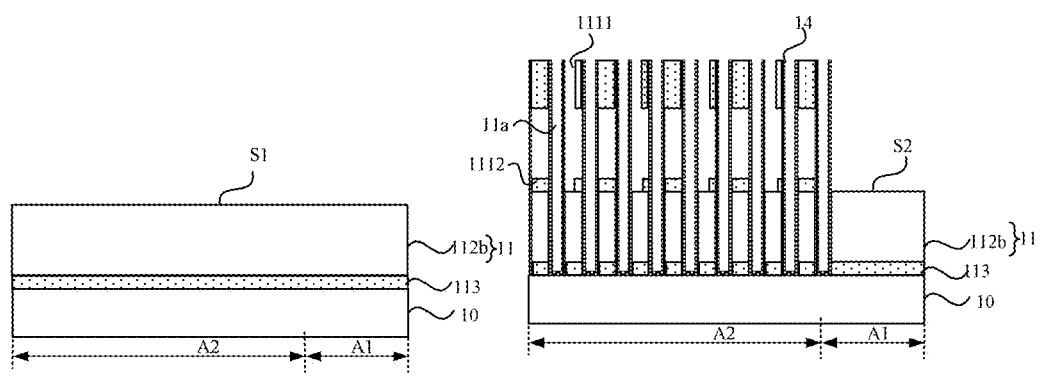
FIG. 16 is a structural schematic diagram of forming second openings in a second support layer provided in the embodiment of the present disclosure.

FIG. 16 is a structural schematic diagram of forming the second openings 1112 in the second support layer 111b provided in the embodiment of the present disclosure. In the present embodiment, the second sacrificial layer 112b is exposed based on the second openings 1112, the first openings 1111 shown in FIG. 15 being in one-to-one correspondence with the second openings 1112 shown in FIG. 16.

S240, remove, based on the second openings 1112 through wet etching, the second sacrificial layer 112b.

Figure 17:
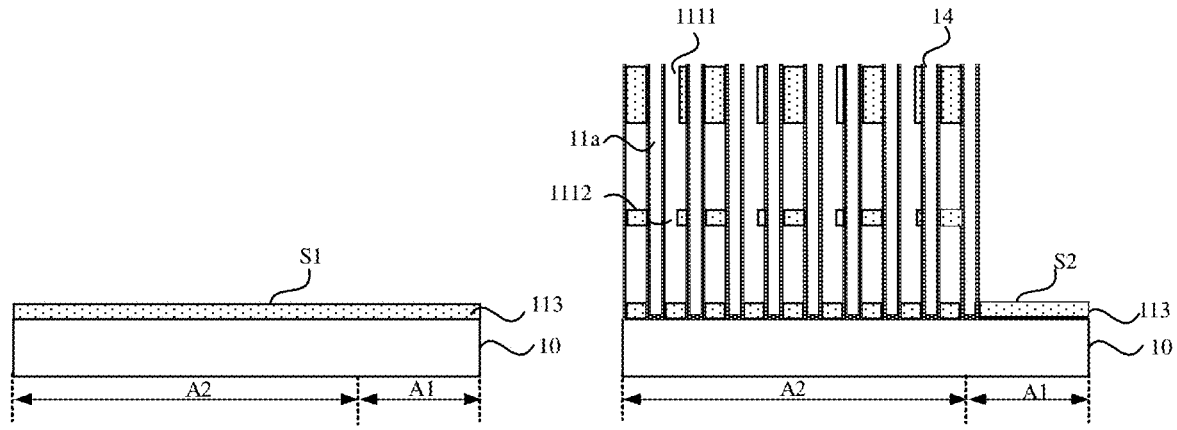
FIG. 17 is a structural schematic diagram of removing, based on the second openings, a second sacrificial layer provided in the embodiment of the present disclosure.

FIG. 17 is a structural schematic diagram of removing, based on the second openings 1112, the second sacrificial layer 112b provided in the embodiment of the present disclosure. In the present embodiment, the second sacrificial layer 112b shown in FIG. 16 is removed based on the second openings 1112 through wet etching, and at the moment, the entire substrate to be etched 11 is etched away, then a capacitor dielectric layer and an upper electrode layer may be formed thereon, and thus a complete capacitor structure is formed.

In the method for manufacturing a capacitor provided in the present embodiment, the portion, in the edge area S1, of the first support layer 111a is removed before the capacitor holes 11a are formed through etching, so that when the substrate to be etched 11 is etched and the first openings 1111 are formed in the first support layer 111a, the first openings 1111 are transferred to the first sacrificial layer 112a, and the portion, in the edge area S1, of the first support layer 111a will not peel off.

Figure 18:
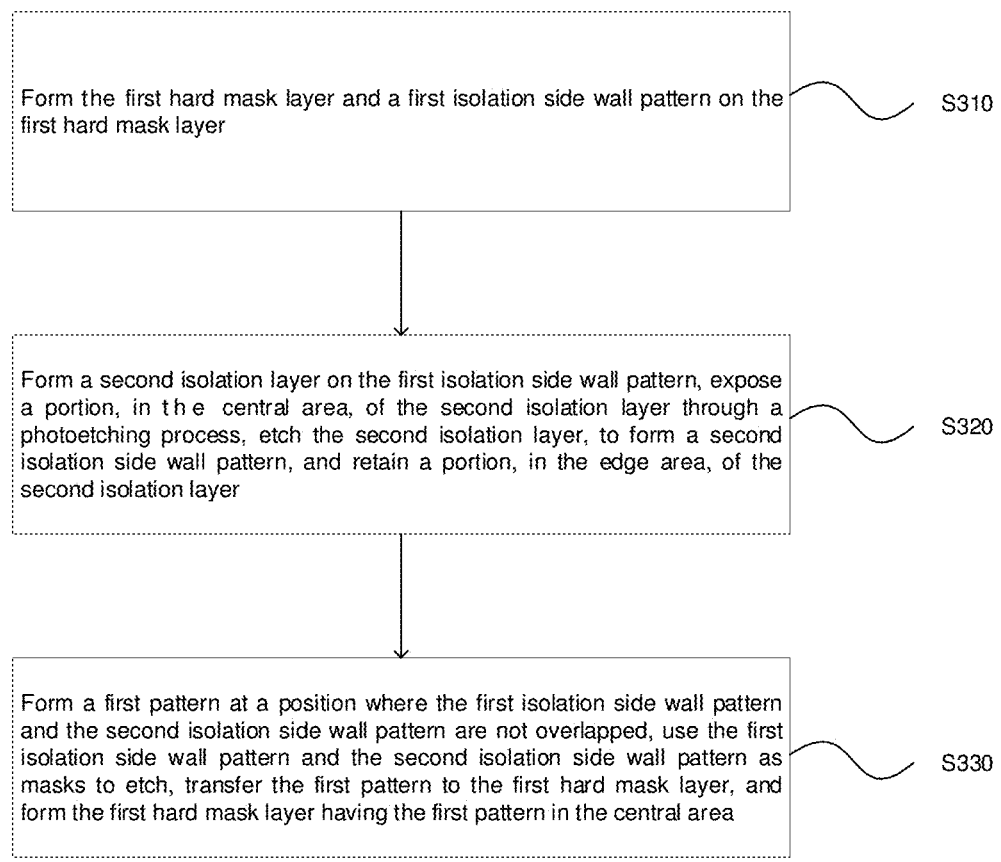
FIG. 18 is a schematic flowchart of yet another method for manufacturing a capacitor provided in the embodiment of the present disclosure.

FIG. 18 is a schematic flowchart of yet another method for manufacturing a capacitor provided in the embodiment of the present disclosure. After a portion, in an edge area S1, of a first support layer 111a is removed, forming a first hard mask layer 13 having a first pattern 16 in a central area S2 on a substrate to be etched 11 may include:

S310, form a first hard mask layer 13 and a first isolation side wall pattern 13a on the first hard mask layer 13.

Figure 19:
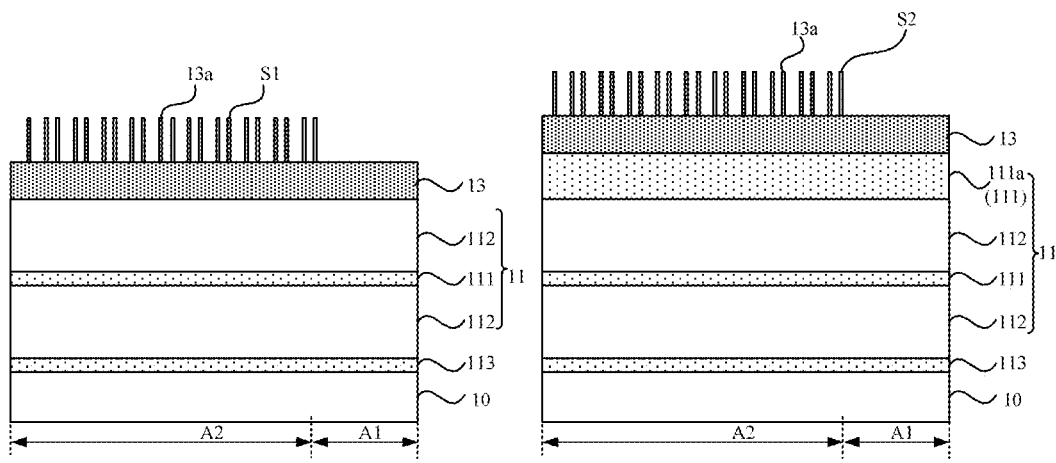
FIG. 19 is a structural schematic diagram of forming a first isolation side wall pattern on a first hard mask layer provided in the embodiment of the present disclosure.

FIG. 19 is a structural schematic diagram of forming the first isolation side wall pattern 13a on the first hard mask layer 13 provided in the embodiment of the present disclosure. One first hard mask layer 13 is formed on the first support layer 111a and the first isolation side wall pattern 13a is formed on the first hard mask layer 13. The first isolation side wall pattern 13a may be formed through a patterning process. In a specific example, the first isolation side wall patterns 13a may be formed through a process including, but not limited to, a self-aligned double patterning process. The first hard mask layer 13 may include a single layer or multi-layer structure and be made from polysilicon, silicon oxide, an amorphous carbon layer (ACL), a spin on hard mask (SOH), etc.

S320, form a second isolation layer 15 on the first isolation side wall pattern 13a, expose a portion, in the central area S2, of the second isolation layer 15 through a photoetching process, etch the second isolation layer 15, to form a second isolation side wall pattern 15a, and retain a portion, in the edge area S1, of the second isolation layer 15.

Figure 20:
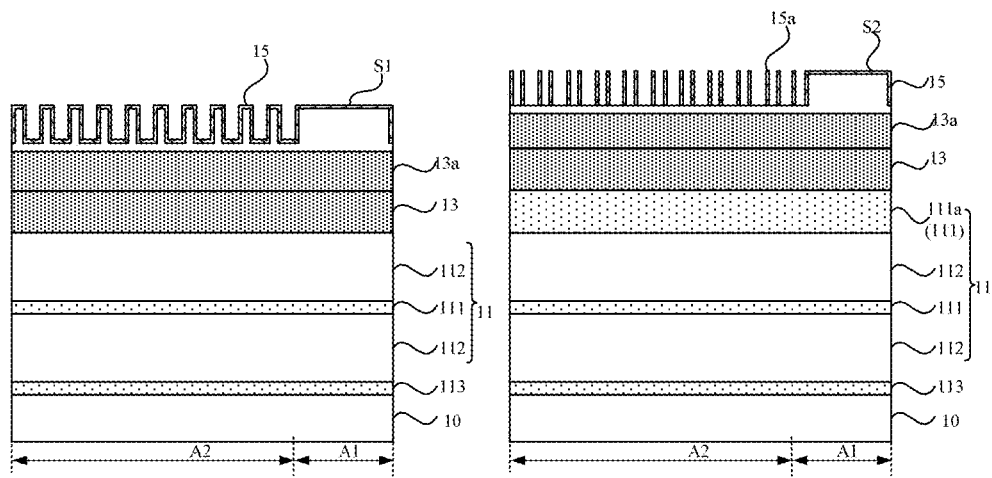
FIG. 20 is a structural schematic diagram of forming a second isolation side wall pattern on a second hard mask layer provided in the embodiment of the present disclosure.

FIG. 20 is a structural schematic diagram of forming the second isolation side wall pattern 15a on the first isolation side wall pattern 13a provided in the embodiment of the present disclosure. The second isolation layer 15 is formed on the first isolation side wall pattern 13a, the second isolation side wall pattern 15a is arranged only in the central area S2 through the photoetching process, the portion, in the edge area S1, of the second isolation layer 15 is not etched, to retain the portion, in the edge area S1, of the second isolation layer 15. Therefore, a capacitor hole 11a is prevented from being formed in the edge area S1 in a subsequent process, thereby effectively preventing a situation that since the edge area S1 is provided with a capacitor structure, the capacitor structure collapses in a subsequent manufacturing process to influence an overall yield of a wafer 1.

S330, form the first pattern 16 at a position where the first isolation side wall pattern 13a and the second isolation side wall pattern 15a are not overlapped, use the first isolation side wall pattern 13a and the second isolation side wall pattern 15a as masks to etch, transfer the first pattern 16 to the first hard mask layer 13, and form the first hard mask layer 13 having the first pattern 16 in the central area S2.

Figure 21:
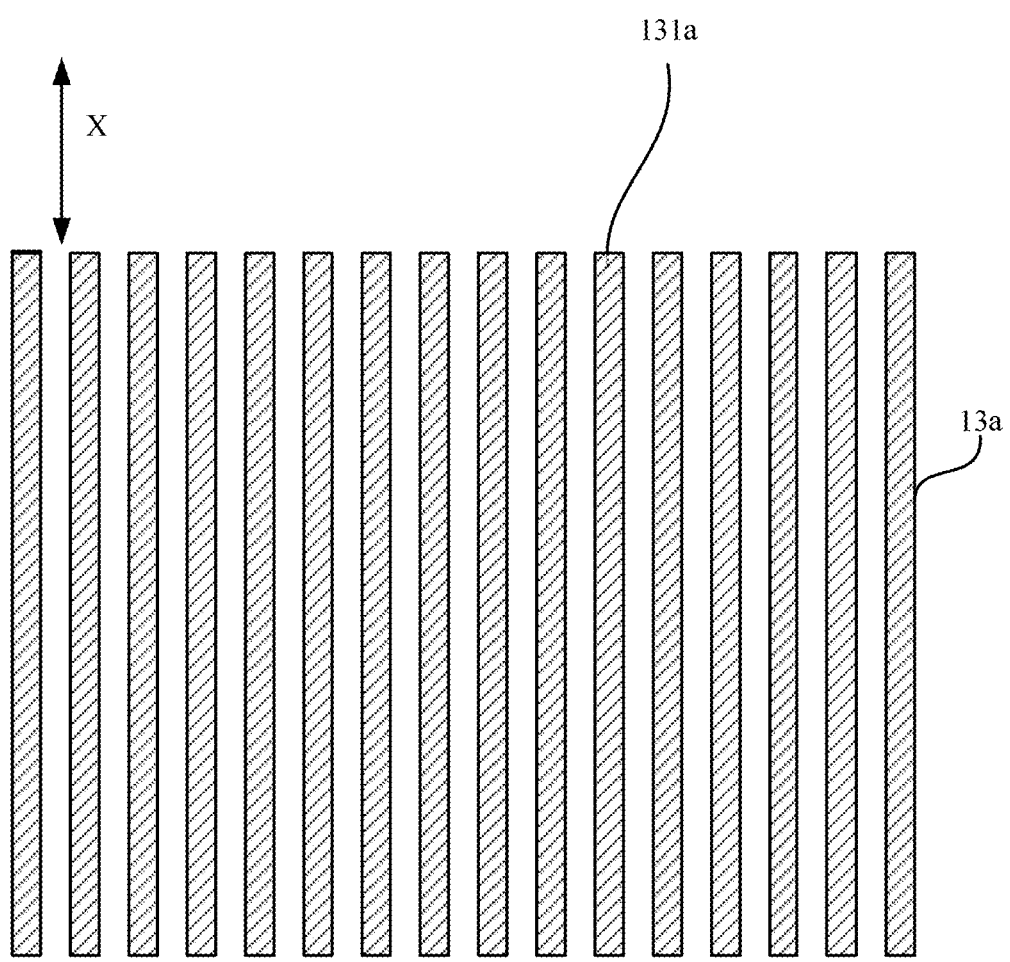
FIG. 21 is a top view of the first isolation side wall pattern provided in the embodiment of the present disclosure.
Figure 22:
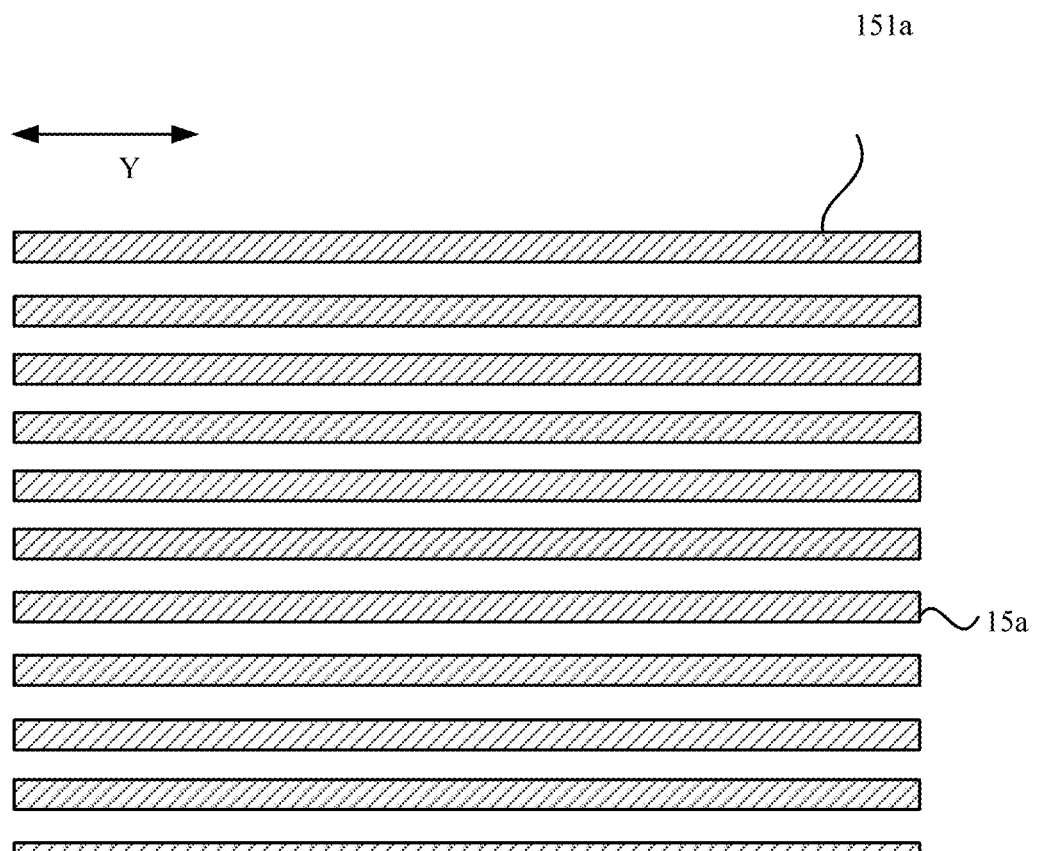
FIG. 22 is a top view of the second isolation side wall pattern provided in the embodiment of the present disclosure.

FIG. 21 is a top view of the first isolation side wall pattern 13a provided in the embodiment of the present disclosure. As shown in FIG. 21, the first isolation side wall pattern 13a may include a plurality of first stripe structures 131a arranged parallel to one another. Similarly, FIG. 22 is a top view of the second isolation side wall pattern 15a provided in the embodiment of the present disclosure. As shown in FIG. 22, the second isolation side wall pattern 15a may also include a plurality of second stripe structures 151a arranged parallel to one another, where the first stripe structure 131a may extend in a first direction X, and the second stripe structure 151a may extend in a second direction Y, in the present embodiment, the first direction X intersecting with the second direction Y, and for example, an included angle between the first direction X and the second direction Y being 60-120 degrees.

Figure 23:
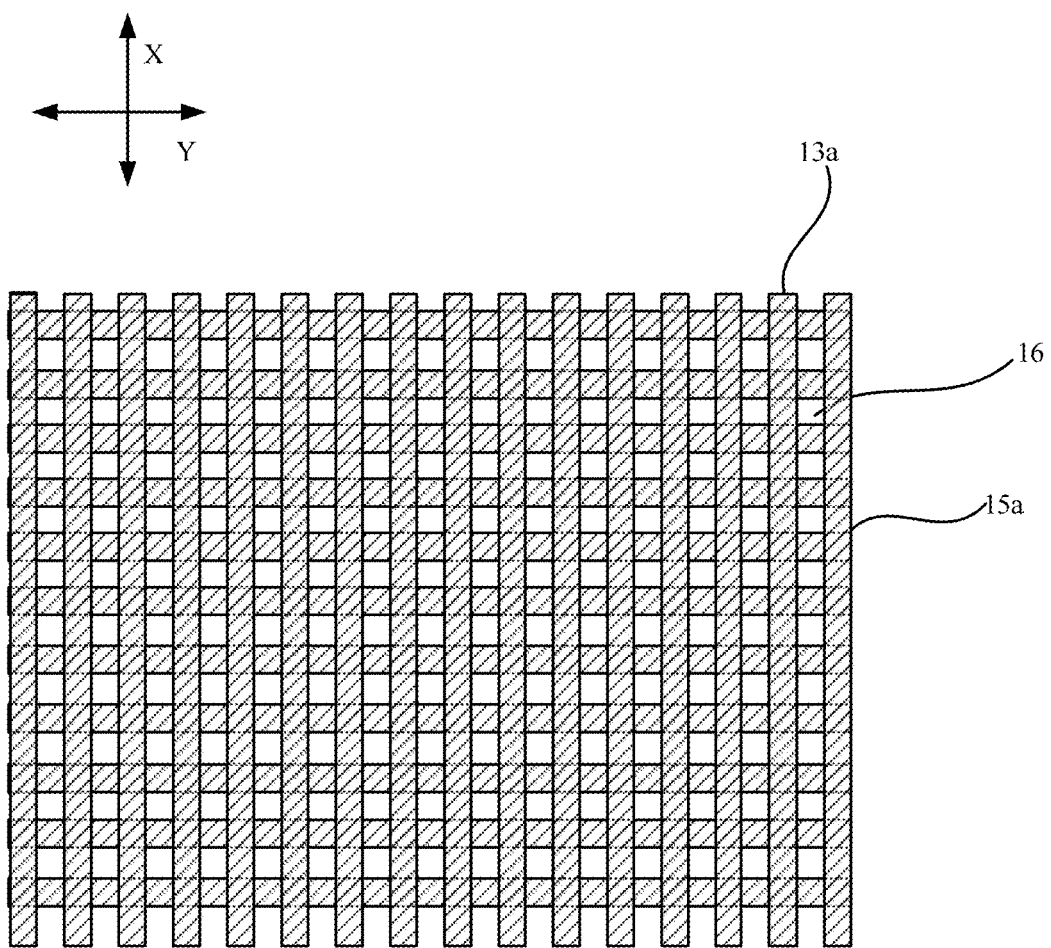
FIG. 23 is a top view of a first hard mask layer and a second hard mask layer provided in the embodiment of the present disclosure.

The first isolation side wall pattern 13a and the second isolation side wall pattern 15a are superimposed to obtain a structure shown in FIG. 23. FIG. 23 is a top view of a first isolation side wall pattern 13a and a second isolation side wall pattern 15a provided in the embodiment of the present disclosure. The first pattern 16 is formed in the portion where the first isolation side wall pattern 13a and the second isolation side wall pattern 15a are not overlapped. The present embodiment uses the first isolation side wall pattern 13a and the second isolation side wall pattern 15a as the masks to transfer the first pattern 16 to the first hard mask layer 13, to obtain a structure as shown in FIG. 6, and form the first hard mask layer 13 having the first pattern 16. In addition, since the entire portion, in the edge area S1, of the second isolation layer 15 covers an underlayer 10, instead of being etched into the second isolation side wall pattern 15a in step S320, when the first isolation side wall pattern 13a and the second isolation side wall pattern 15a are used as the masks to etch the first hard mask layer 13, no first pattern 16 is formed on a portion, in the edge area S1, of the first hard mask layer 13. As shown in FIG. 6, the first pattern 16 includes through holes 131 arranged in an array, so as to use the first hard mask layer 13 as the mask conveniently, and form capacitor holes 11a in one-to-one correspondence with the through holes 131.

In the present embodiment, a formation process of the first pattern 16 of the first hard mask layer 13 is described in detail and particularly includes: superpose the first isolation side wall pattern 13a and the second isolation side wall pattern 15a, and when the second isolation side wall pattern 15a is formed, retain the portion, in the edge area S1, of the second isolation layer 15, to avoid patterning the portion, in the edge area S1, of the second isolation layer 15, so as to avoid forming the capacitor holes 11a in the edge area S1 in the subsequent process, and therefore, a situation that since the edge area S1 is provided with the capacitor structure, the capacitor structure collapses in the subsequent manufacturing process to influence the overall yield of the wafer 1 is effectively prevented.

Figure 24:
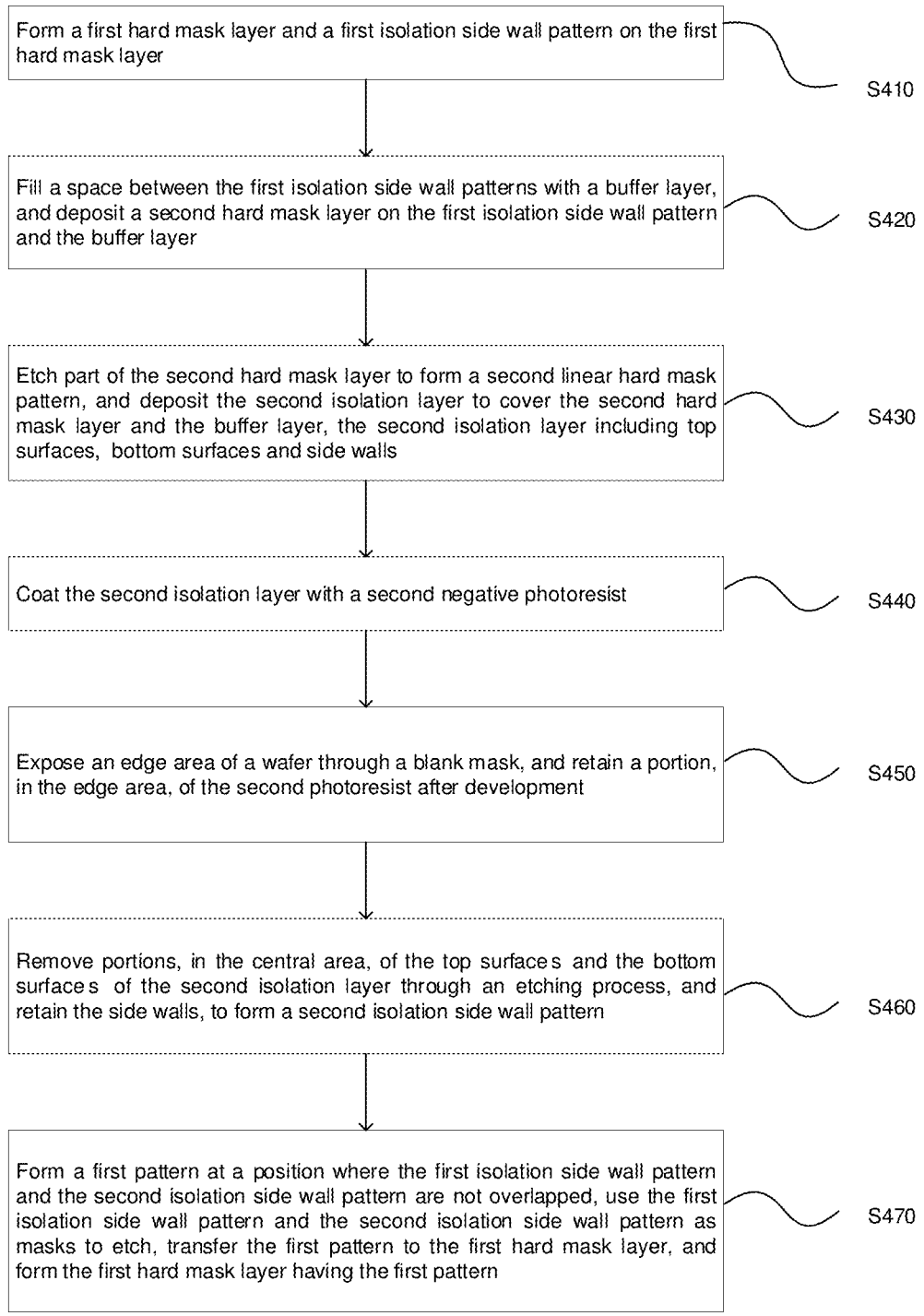
FIG. 24 is a schematic flowchart of yet another method for manufacturing a capacitor provided in the embodiment of the present disclosure.

FIG. 24 is a schematic flowchart of yet another method for manufacturing a capacitor provided in the embodiment of the present disclosure. After a portion, in an edge area S1, of a first support layer 111a is removed, forming a first hard mask layer 13 having a first pattern 16 on a substrate to be etched 11 may also include:

S410, form a first hard mask layer 13 and a first isolation side wall pattern 13a on the first hard mask layer 13.

S420, fill a space between the first isolation side wall patterns 13a with a buffer layer 17, and deposit a second hard mask layer 18 on the first isolation side wall pattern 13a and the buffer layer 17.

S430, etch part of the second hard mask layer 18 to form a second linear hard mask pattern 18a, and deposit the second isolation layer 15 to cover the second hard mask layer 18 and the buffer layer 17, the second isolation layer 15 including top surfaces 151, bottom surfaces 152 and side walls 153.

Figure 25:
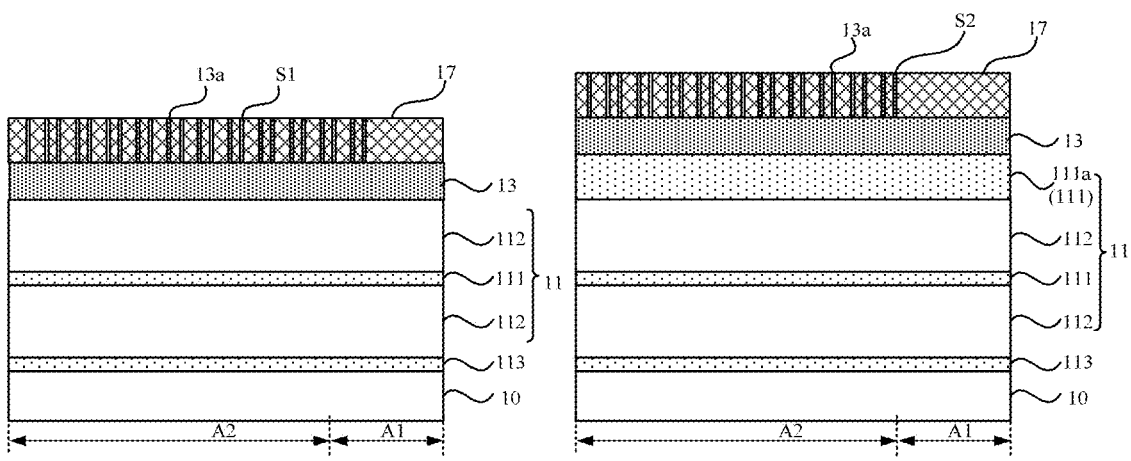
FIG. 25 is a structural schematic diagram of filling a space between first isolation side wall patterns with a buffer layer provided in the embodiment of the present disclosure.
Figure 26:
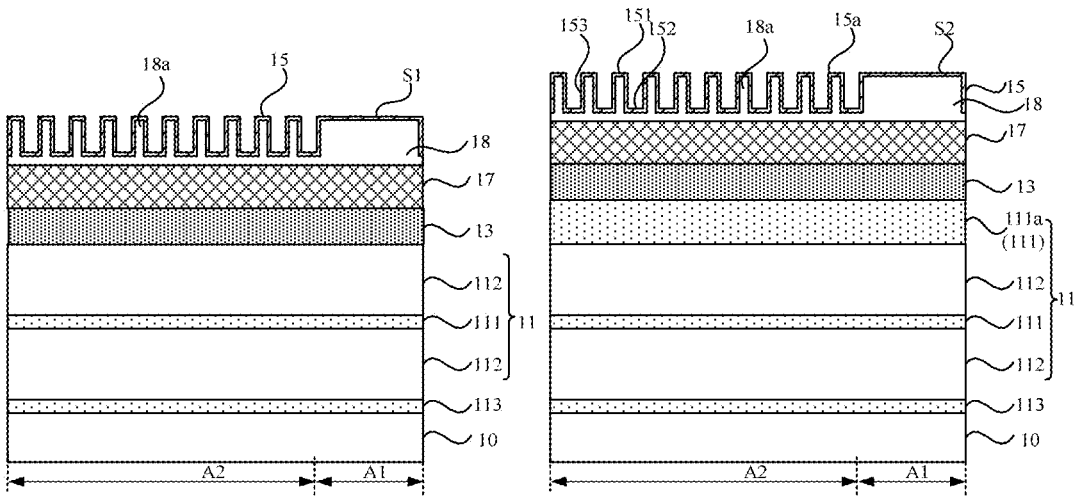
FIG. 26 is a structural schematic diagram of forming a second isolation layer provided in the embodiment of the present disclosure.

Forming the second isolation layer 15 on the first isolation side wall pattern 13a is executed in steps S420 and S430 mentioned above and particularly includes: form the buffer layer 17 on the first isolation side wall pattern 13a on the basis of a structure in FIG. 19. FIG. 25 is a structural schematic diagram of filling the space between the first isolation side wall patterns 13a with the buffer layer 17 provided in the embodiment of the present disclosure. As shown in FIG. 25, after the buffer layer 17 is formed on the first isolation side wall pattern 13a, the buffer layer 17 is flattened, and therefore, the buffer layer 17 exists only between first stripe structures 131a of the first isolation side wall pattern 13a. In other embodiments, the flattened buffer layer 17 may also cover the top of the first isolation side wall pattern 13a. FIG. 26 is a structural schematic diagram of forming the second isolation layer 15 provided in the embodiment of the present disclosure. As shown in FIG. 26, one second hard mask layer 18 is formed on the buffer layer 17, and the second hard mask layer 18 is patterned to form the second linear hard mask pattern 18a. In the present embodiment, the second linear hard mask pattern 18a extends in a second direction Y as well. On this basis, the second isolation layer 15 is deposited on the second hard mask layer 18, and the second isolation layer 15 completely covers the second linear hard mask pattern 18a, the second isolation layer 15 including the top surfaces 151, the bottom surfaces 152 and the side walls 153.

S440, coat the second isolation layer 15 with a second negative photoresist 19.

S450, expose an edge area S1 of the wafer 1 through a blank mask, and retain a portion, in the edge area S1, of the second photoresist 19 after development.

Figure 27:
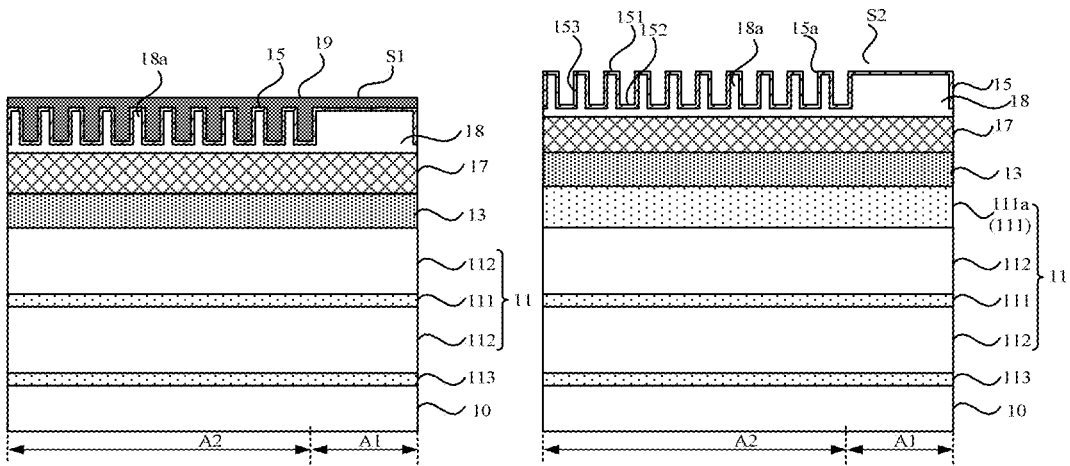
FIG. 27 is a structural schematic diagram of coating the second isolation layer with a second negative photoresist provided in the embodiment of the present disclosure.

On the basis of a structure shown in FIG. 26, the second isolation layer 15 is coated with the second negative photoresist 19. FIG. 27 is a structural schematic diagram of coating the second isolation layer 15 with the second negative photoresist 19 provided in the embodiment of the present disclosure. As shown in FIG. 27, the entire second isolation layer 15 is coated with the second negative photoresist 19, the edge area S1 is exposed (particularly, the edge area S1 of the wafer 1 may be exposed by shot through the blank mask), the portion, in the edge area S1, of the second photoresist 19 is retained, and a portion, in a central area S2, of the second photoresist 19 is removed. The second photoresist 19 may have a thickness of 50-200 nm, preferably, 80-120 nm.

S460, remove portions, in the central area S2, of the top surfaces 151 and the bottom surfaces 152 of the second isolation layer 15 through an etching process, and retain the side walls 153, to form a second isolation side wall pattern 15a.

With continued reference to FIG. 20, it is particularly required to coat an entire wafer 1 having the negative photoresist with a positive photoresist, and expose and develop a die array region A2, to expose a portion, in the die array region A2, of the second isolation layer 15. Since a die in the edge area S1 has the negative photoresist, the portion, for the die in the edge area S1, of the second isolation layer 15 is entirely retained during etching, and a portion, in a die array region A2 in the central area S2, of the second isolation layer 15 is etched to form the second isolation side wall pattern 15a.

Figure 28:
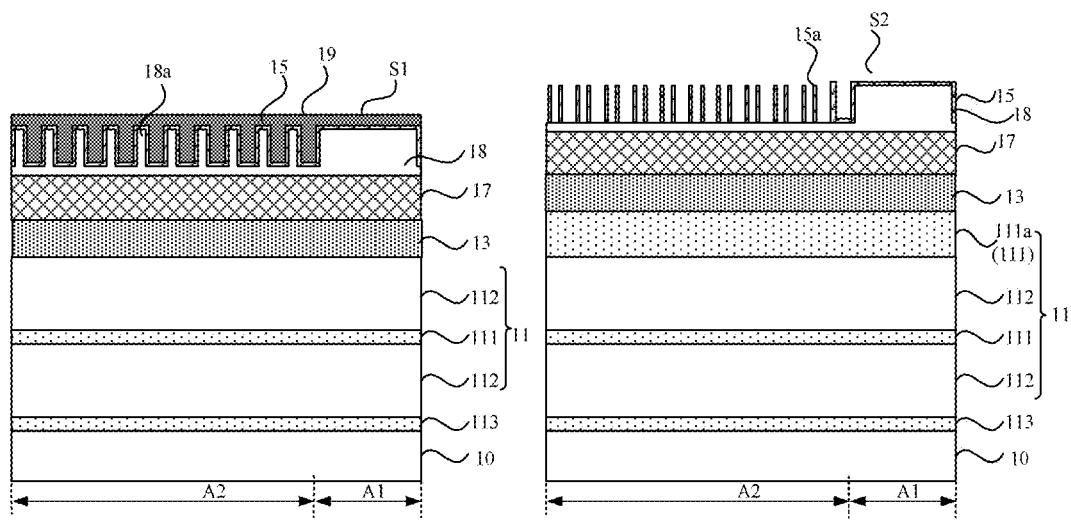
FIG. 28 is a structural schematic diagram of forming a second isolation side wall pattern provided in the embodiment of the present disclosure.

Exposing the portion, in the central area S2, of the second isolation layer 15 through a photoetching process, and etching the second isolation layer 15, to form the second isolation side wall pattern 15a is executed in steps S440-S460. FIG. 28 is a structural schematic diagram of forming the second isolation side wall pattern 15a provided in the embodiment of the present disclosure. As shown in FIG. 28, the portions, in the central area S2, of the top surfaces 151 and the bottom surfaces 152 of the second isolation layer 15 are removed through the etching process, and only the side walls 153 is retained, to form the second isolation side wall pattern 15a. Particularly, portions, in the die array region A2 in the central area S2, of the top surfaces 151 and the bottom surfaces 152 of the second isolation layer 15 are removed, to form the second isolation side wall pattern 15a. It should be noted that since the portion, in the edge area S1, of the second photoresist 19 is retained, a pattern, formed through etching, in the edge area S1 is transferred to the second photoresist 19, rather than the second isolation layer 15 in a process of etching the second isolation layer 15, thereby preventing a capacitor structure from being formed in the edge area S1, and ensuring reliability of a capacitor manufacturing environment.

S470, form the first pattern 16 at a position where the first isolation side wall pattern 13a and the second isolation side wall pattern 15a are not overlapped, use the first isolation side wall pattern 13a and the second isolation side wall pattern 15a as masks to etch, transfer the first pattern 16 to the first hard mask layer 13, and form the first hard mask layer 13 having the first pattern 16.

In the present embodiment, a specific process of forming the second isolation side wall pattern 15a is described in detail. When the second isolation side wall pattern 15a is formed, the portion, in the edge area S1, of the second isolation layer 15 is retained through the second negative photoresist 19, so as to avoid patterning the portion, in the edge area S1, of the second isolation layer 15, thereby preventing the portion, in the edge area S1, of the second isolation layer 15 from peeling off, and effectively protecting a capacitor structure array.

Figure 29:
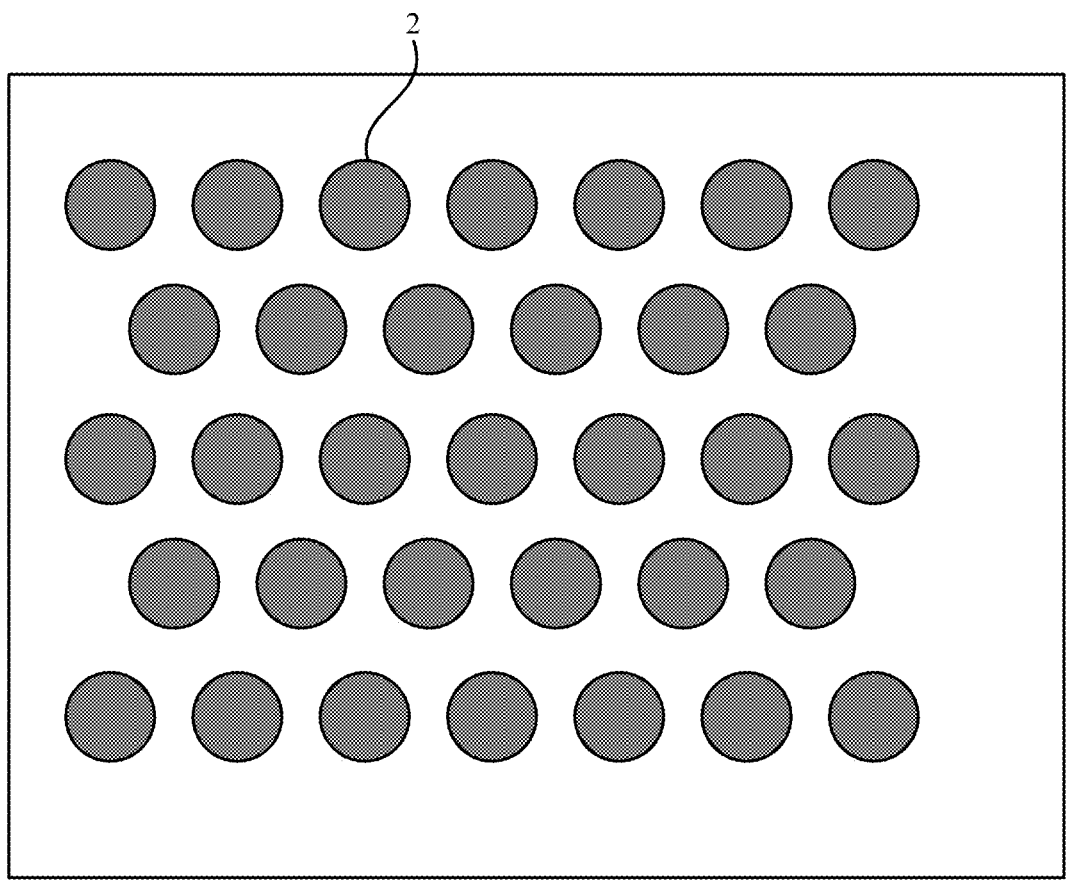
FIG. 29 is a structural schematic diagram of a capacitor array structure provided in the embodiment of the present disclosure.

The embodiment of the present disclosure further provides a capacitor array structure. FIG. 29 is a schematic structural diagram of a capacitor array structure provided in the embodiment of the present disclosure. As shown in FIG. 29, the capacitor array structure provided in the embodiment of the present disclosure is made through a method for manufacturing a capacitor provided in any embodiment of the present disclosure, and includes a plurality of capacitors 2 arranged in an array. The capacitor array structure in the present embodiment has a technical feature of a method for manufacturing a capacitor provided in any embodiment of the disclosure, and a beneficial effect of a method for manufacturing a capacitor provided in any embodiment of the disclosure.

Figure 30:
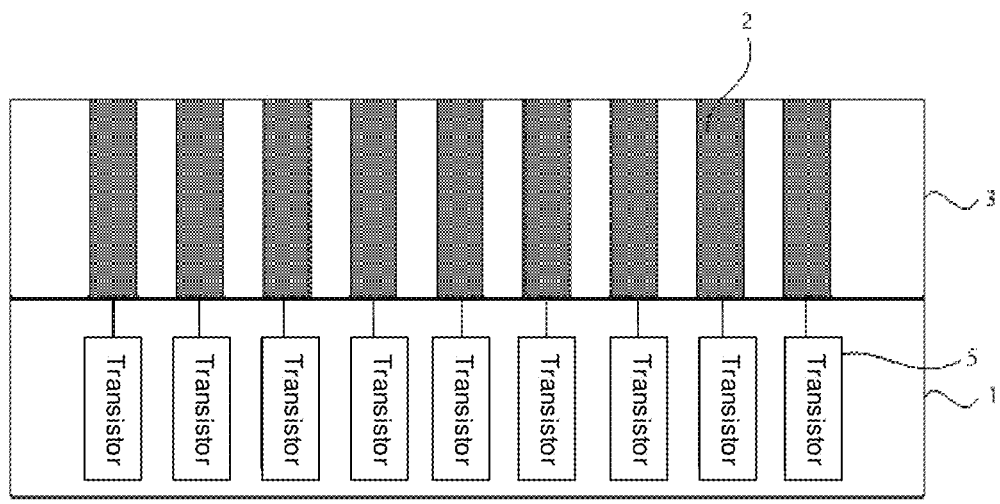
FIG. 30 is a structural schematic diagram of a semiconductor memory provided in the embodiment of the present disclosure.

On the basis of the same concept, FIG. 30 is a structural schematic diagram of a semiconductor memory provided in the embodiment of the present disclosure. As shown in FIG. 30, the embodiment of the present disclosure further provides a semiconductor memory. The semiconductor memory includes a capacitor array structure 3 provided in any embodiment of the present disclosure, and a transistor layer 4, the transistor layer 4 including a transistor 5 arranged in one-to-one correspondence with a capacitor 2 and configured to write and read a signal into and from the capacitor.

Those skilled in the art could easily conceive of other implementation solutions of the present disclosure upon consideration of the disclosures of the description and practice. The present disclosure is intended to cover any variations, uses or adaptive changes of the present disclosure, which follow the general principle of the present disclosure and include common general knowledge or conventional technical means in the art, which is not disclosed in the present disclosure. The description and the embodiments are exemplary only, and the true scope and spirit of the present disclosure are indicated by the following claims.

It should be understood that the present disclosure is not limited to a precise structure that has been described above and illustrated in the accompanying drawings, and various modifications and changes may be made without departing from the scope of the present disclosure. The scope of the present disclosure is limited only by the appended claims.

INDUSTRIAL APPLICABILITY

According to a method for manufacturing a capacitor, a capacitor array structure and a semiconductor memory of the present disclosure, a process of manufacturing a capacitor includes: firstly, form a substrate to be etched to prepare capacitor holes, the substrate to be etched including at least one sacrificial layer and at least one support layer, the sacrificial layer and the support layer being alternately arranged, and the topmost layer being a first support layer; enable a wafer to include a central area and an edge area surrounding the central area; form a first hard mask layer having a first pattern in the central area on the substrate to be etched, the first pattern including through holes arranged in an array; use the first hard mask layer as a mask to etch the substrate to be etched, to form the capacitor holes, no capacitor hole being formed in the edge area given that no through hole is formed on a portion, in the edge area of the wafer, of the first hard mask layer, then deposit a lower electrode layer on the capacitor holes, remove, layer by layer, the substrate to be etched, and sequentially form a capacitor dielectric layer and an upper electrode layer. According to the present embodiment, since no capacitor structure is arranged in the edge area of the wafer, a film layer structure in the edge area will not be incomplete (patterned), thereby avoiding a situation that owing to a process, the capacitor structure in the edge area collapses, and thus an overall yield of the wafer is influenced, and improving a production quality and production efficiency of the capacitor accordingly.

The invention claimed is:

1. A method for manufacturing a capacitor, comprising:
providing a wafer, the wafer comprising a plurality of dies distributed in an array, and the dies having a same underlayer; forming a substrate to be etched on the underlayer, the substrate to be etched comprising at least one sacrificial layer and at least one support layer, the sacrificial layer and the support layer being alternately arranged, and one side, away from the underlayer, of the substrate to be etched being a first support layer;
enabling the wafer to comprise a central area and an edge area surrounding the central area;
removing a portion, for dies in the edge area, of the first support layer;
forming a first hard mask layer having a first pattern in the central area on the substrate to be etched, the first pattern comprising through holes arranged in an array, and no through hole being formed in a part of the first hard mask layer corresponding to the edge area; using the first hard mask layer as a mask to etch the substrate to be etched, to form capacitor holes in the central area, no capacitor hole being formed in an array region and a peripheral region of each of the dies in the edge area; and
depositing a lower electrode layer on a bottom and a side wall of each of the capacitor holes, and removing, layer by layer, part of the substrate to be etched; and sequentially forming a capacitor dielectric layer and an upper electrode layer on the lower electrode layer.

2. The method for manufacturing the capacitor according to claim 1, wherein the edge area has a width less than or equal to 8 mm in a direction from the central area to the edge area.

3. The method for manufacturing the capacitor according to claim 1, wherein the removing a portion, for dies in the edge area, of the first support layer comprises:
exposing the portion, for the dies in the edge area, of the first support layer through a photoetching process, etching the exposed portion of the first support layer, and forming an the edge area exposing the sacrificial layer.

4. The method for manufacturing the capacitor according to claim 3, wherein the exposing the portion, for the dies in the edge area, of the first support layer through a photoetching process comprises:
coating the substrate to be etched with a first positive photoresist; exposing the edge area of the wafer through a blank mask; and developing and etching to form the edge area exposing the sacrificial layer.

5. The method for manufacturing the capacitor according to claim 4, wherein the first positive photoresist has a thickness of 50-200 nm.

6. The method for manufacturing the capacitor according to claim 1, wherein the substrate to be etched comprises: a second sacrificial layer, a second support layer, a first sacrificial layer and the first support layer being sequentially formed in a direction away from the underlayer; and
the removing, layer by layer, part of the substrate to be etched comprises:
forming first openings in the first support layer, to expose the first sacrificial layer; transferring the first openings in the edge area of the wafer to the first sacrificial layer;
removing, based on the first openings, the first sacrificial layer;
forming second openings in the second support layer, to expose the second sacrificial layer; and
removing, based on the second openings, the second sacrificial layer, the first openings being in one-to-one correspondence with the second openings.

7. The method for manufacturing the capacitor according to claim 1, wherein the forming a first hard mask layer having a first pattern in the central area on the substrate to be etched comprises:
forming the first hard mask layer and a first isolation side wall pattern in a first direction on the first hard mask layer;
forming a second isolation layer on the first isolation side wall pattern, exposing a portion, for dies in the central area, of the second isolation layer through a photoetching process, etching the second isolation layer, to form a second isolation side wall pattern in a second direction, and retaining a portion, for the dies in the edge area, of the second isolation layer; and forming the first pattern at a position where the first isolation side wall pattern and the second isolation side wall pattern are not overlapped, using the first isolation side wall pattern and the second isolation side wall pattern as masks to etch, transferring the first pattern to the first hard mask layer, and forming the first hard mask layer having the first pattern in the central area.

8. The method for manufacturing the capacitor according to claim 7, wherein the first hard mask layer comprises a single-layer or multi-layer structure.

9. The method for manufacturing the capacitor according to claim 7, wherein the first isolation side wall pattern is formed through a patterning process.

10. The method for manufacturing the capacitor according to claim 7, wherein the forming a second isolation layer on the first isolation side wall pattern comprises:

filling a space between the first isolation side wall pattern with a buffer layer, and depositing a second hard mask layer on the first isolation side wall pattern and the buffer layer;

etching part of the second hard mask layer to form a second linear hard mask pattern, and depositing the second isolation layer to cover the second hard mask layer and the buffer layer, the second isolation layer comprising top surfaces, bottom surfaces and side walls connecting the top surfaces and the bottom surfaces.

11. The method for manufacturing the capacitor according to claim 10, wherein the exposing a portion, for dies in the central area, of the second isolation layer through a photo-etching process, and etching the second isolation layer, to form a second isolation side wall pattern comprises:

coating the second isolation layer with a second negative photoresist, exposing the edge area of the wafer through a blank mask, and retaining a portion, in the edge area, of the second negative photoresist after development; removing portions, in the central area, of the top surfaces and the bottom surfaces of the second isolation layer through an etching process, and retaining the side walls, to form the second isolation side wall pattern.

12. The method for manufacturing the capacitor according to claim 11, wherein the second negative photoresist has a thickness of 50-200 nm.

13. A capacitor array structure, made through the method for manufacturing the capacitor according to claim 1.

14. A semiconductor memory, comprising the capacitor array structure according to claim 13 and a transistor layer comprising a transistor arranged in one-to-one correspondence with the capacitor.

* * * * *